May 28, 1968 E. H. LAYER, JR., ET AL 3,386,008

INTEGRATED CIRCUIT

Filed Aug. 31, 1964

INVENTORS

EDWIN H. LAYER, JR.

WILLIAM F. J. HARE

BY John J. Gaydos

ATTORNEY

United States Patent Office 3,386,008

Patented May 28, 1968

3,386,008

INTEGRATED CIRCUIT

Edwin H. Layer, Jr., Elkhart, Ind., and William F. J. Hare, Thornhill, Ontario, Canada, assignors to CTS Corporation, Elkhart, Ind., a corporation of Indiana Filed Aug. 31, 1964, Ser. No. 394,101

4 Claims. (Cl. 317—101)

Figures 1, 2:
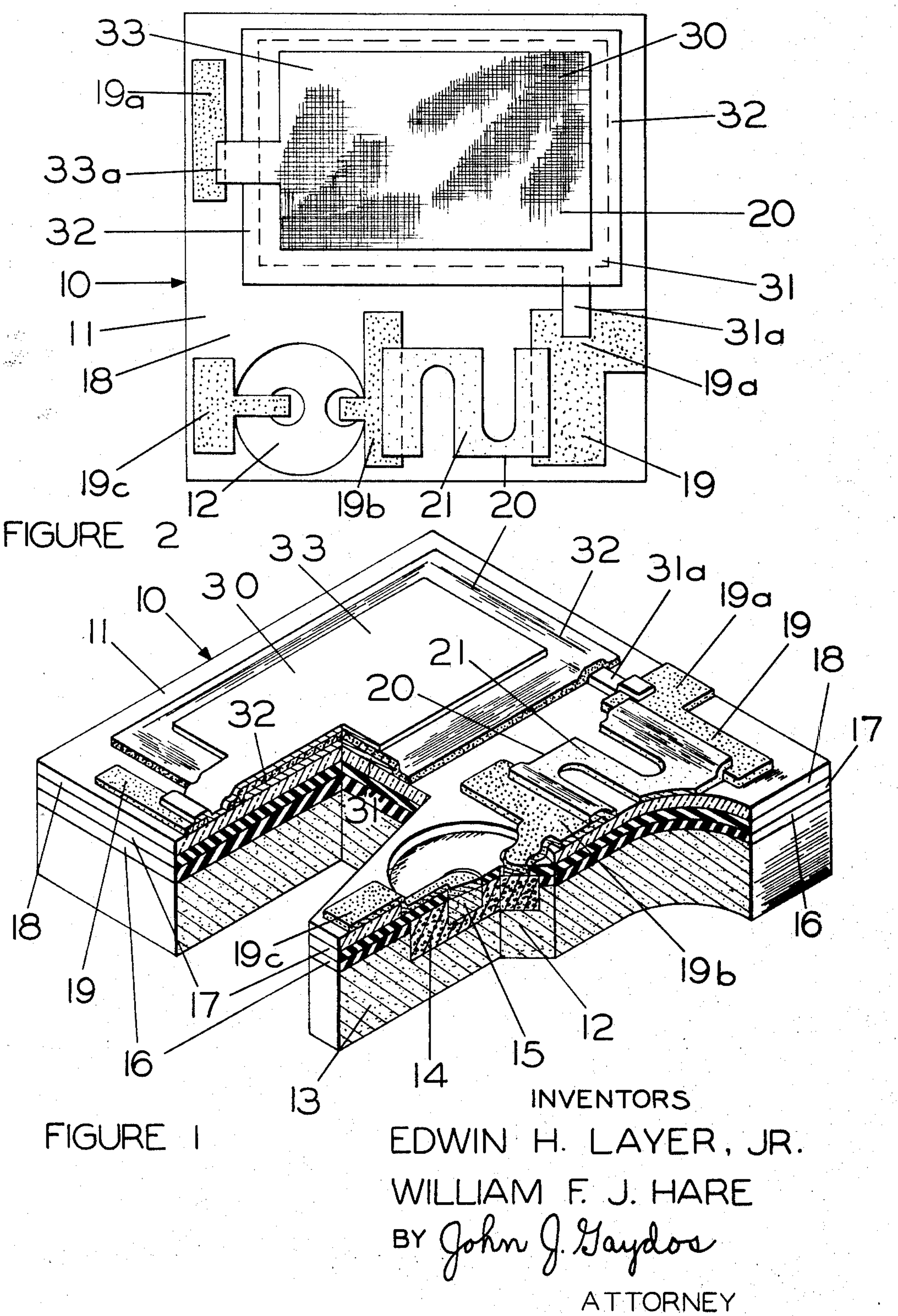

The present invention relates to microminiature electronic circuitry, and, more particularly, to a microminiature integrated circuit comprising a body of semiconductor material containing an active device and having deposited on a portion thereof one or more passive devices such as a resistance element and/or a capacitor and to a method of making the same.

Whenever electronic circuits are employed in electronic equipment where physical space is at a premium, it is necessary that the size of each component of the electronic circuit be as small as possible. One widely used approach is based on the fabrication of passive elements by controlled impurity diffusion into a body of semiconductor material. As this processing is normally accomplished during the diffusion cycle for fabrication of the active elements, severe limitations are placed upon the passive components. For example, sheet resistances greater than 1000 ohms per square are generally incompatible with the active device requirements. The control of geometry and diffusion parameters required for the formation of precision sensitive elements is usually much greater than that required for active device fabrication. Since the body of the resistance element consists of a doped portion of a body of semiconductor material, the diffused resistance element has a rather high temperature coefficient of resistance, i.e., at least several hundred parts per million per degree centigrade. Finally the requirement of providing a reverse biased junction to isolate the diffused passive element from the remaining semiconductor substrate material introduces parasitic capacitive and/or active components which complicate and often limit the resultant integrated circuit.

It would clearly be advantageous to provide an integrated structure of comparable size that was free of the above limitations. Limited success in overcoming the above problem has been accomplished by depositing a thin film of metal such as vacuum deposited Nichrome or chromium, or sputtered tantalum, or a metal oxide as tin oxide ($SnO_2$) to form a resistance element on the body of semiconductor material. The sheet resistance of metallic thin film is, however, available only from 40 to 1000 ohms per square with temperature coefficients of resistance below several hundred parts per million per degree centigrade, and under the same temperature coefficient conditions, the tin oxide thin films are available in the range of 80 to 4000 ohms per square. An extremely large surface area is, therefore, necessary whenever a resistance element with a high ohmic value such as in excess of 100,000 ohms is desired. Metal films having a high or low sheet resistance also have a poor temperature coefficient of resistance, i.e., a high sheet resistance gives a high negative temperature coefficient and a low sheet resistance gives a high positive temperature coefficient. It would, therefore, be desirable to provide an integrated circuit comprising a body of semiconductor material containing an active device and a resistance element having a sheet resistance of at least up to 300,000 ohms per square deposited onto a surface of the body of semiconductor material adjustable to less than 10 percent and even as low as 1 percent or a fraction thereof and having a temperature coefficient of resistance of 100 parts per million per degree centigrade or less.

The individuals skilled in the art of making integrated circuits comprising a body of semiconductor material containing an active device have long recognized the need for providing a resistance element on a body of semiconductor material having a sheet resistance considerably higher than several thousand ohms per square. With the advent of microminiature electronic circuitry, many new compositions for resistance elements have been developed. For example, some of these compositions comprise particles of one or more of the noble metals dispersed in a glass matrix having a thickness in the range of .0001 to .001 inch in order that sheet resistances at least as high as 300,000 ohms per square are available. Initial investigation revealed that the glass matrix resistance elements could not be deposited on a portion of the body of semiconductor material since the semiconductor material, e.g., silicon, (Si), a fairly good conductor, shorted the resistance element. Attempts to oxidize a surface of the body of semiconductor material and deposit a glass matrix resistance element thereon were also unsuccessful since the oxide layer, e.g., silicon dioxide ($SiO_2$) may be dissolved in the glass composition of the glass matrix resistance element to become shorted to the body of semiconductor material. It would, therefore, also be desirable to provide an integrated circuit comprising a body of semiconductor material containing an active device and having deposited thereon a glass matrix resistance element without shorting the resistance element to the semiconductor material.

Accordingly, an object of the present invention is to provide an integrated circuit comprising a body of semiconductor material containing an active device and having a glass matrix passive device deposited thereon and having a compatible temperature coefficient of expansion and a sheet resistance at least as high as 300,000 ohms per square and adjustable to a tolerance of less than 10 percent.

Another object of the present invention is to provide an integrated circuit comprising a body of semiconductor material having a glass matrix passive device deposited thereon with a temperature coefficient of resistance of 100 parts per million per degree centigrade or less.

Still another object of the present invention is to provide an integrated circuit comprising a body of semiconductor material having a glass matrix passive device deposited thereon and having a glass film with a temperature coefficient of expansion substantially the same as the surface supporting the glass film interposed between a surface of the body and the passive device.

A further object of the present invention is to provide a method of making an integrated circuit comprising a body of semiconductor material containing an active device and a glass matrix passive device.

Further objects and advantages of the present invention will become apparent as the following description proceeds, and the features of novelty characterizing the invention will be pointed out with particularly in the claims annexed to and forming a part of this specification.

Briefly, the present invention is concerned with a microminiature integrated circuit comprising a body of semiconductor material, e.g., silicon, containing an active device and supported on the semiconductor material is a glass matrix passive device as a resistance element and/or a capacitor.

For a better understanding of the present invention, reference may be had to the accompanying drawings wherein the same reference numerals have been applied to like parts and wherein:

FIGURE 1 is a grossly enlarged isometric view of an integrated circuit fabricated in accord with the present invention, with portions broken away to show the details thereof; and FIGURE 2 is a top plan view of the integrated circuit of FIGURE 1, assuming that FIGURE 1 is shown in ful.

Referring now to the drawings, there is illustrated an integrated circuit, generally indicated at 10, comprising a body 11 of semiconductor material of silicon containing an active device 12 and having supported thereon one or more passive devices 20.

Considering first the active device 12, it comprises three semiconductor layers 13, 14, and 15 of alternating conductivity types, i.e., the layers of respectively either P, N and P types or N, P and N types. It is to be understood that the active devices may be prepared by various planar processes where all three semiconductor layers 13, 14, and 15 are diffused in the body of semiconductor material or by other processes, e.g., the diffused collector process or the triple diffused epitaxial diffused process. Layers 14 and 15 are applied to the base layer by well known diffusion techniques or by any other suitable method, e.g., the entire body 11 of semiconductor material may be grown by convenient methods. If diffusion techniques are employed, the inner layer 14 is diffused into the body 13 and thereafter the outer layer 15 is diffused into the layer 14. It is to be understood that the body 11 of semiconductor material need not be rectangular and may be of other suitable configurations, for example, cylindrical.

The diffusion of the semiconductor layers into the body 11 of semiconductor material, generally necessitates the disposition of a barirer layer 16 on the top surface of the body 11 of semiconductor material. For example, the top surface of the body of semiconductor material is oxidized by a suitable method to produce the barrier layer 16. After the barrier layer 16, e.g., a silicon dioxide ($SiO_2$) layer when a silicon semiconductor is employed, is formed on the surface of the body 11 of semiconductor material, the top surface is masked with a photoresistive material. A portion of the barrier layer 16 is then etched away to expose a portion of the body 11 of semiconductor material and control the area to be diffused. After the inner semiconductor layer 14 has been formed in the body of semiconductor material by the diffusion process, the outer surface of the body 11 of semiconductor material is again oxidized to form another barrier layer 17. The second barrier layer is then masked, a further photoresistive material is applied thereover, and a portion is etched away to expose a portion of the inner semiconductor layer 14 thereby permitting, by the diffusion process, an outer semiconductor layer 15 to be formed, the layer 15 commonly being referred to as an island. Additional barrier layers of an oxide of the semiconductor material can readily be formed on the top surface of the body 11 of semiconductor material depending upon the type of active device 12 desired.

For the purpose of insulating the glass matrix passive devices 20 from the barrier layers 16 and 17 or from the body 11 of semiconductor material, a glass film 18 is deposited over a portion or over the entire surface of the barrier layer 17. According to the invention, it is essential that the glass film 18 have substantially the same thermal coefficient of expansion as the barrier layer 17 or the body 11 of semiconductor material depending upon which surface supports the glass film 18. An example of a composition of glass having the same temperature coefficient of expansion as a body of silicon material and a softening point of approximately 900° C. is as follows:

| Glass composition: | Percent by weight |
|---|---|
| Silica—$SiO_2$ | 80 |
| Boric oxide—$B_2O_3$ | 14 |
| Soda—$Na_2O$ | 4 |
| Alumina—$Al_2O_3$ | 2 |

In one form of the invention, it is necessary that the insulating properties of the glass film 18 be maintained after the glass is fired on the barrier layer 15; otherwise, the passive elements 20 will be shorted to the body 11 of semiconductor material. The glass film 18 also must be of sufficient thickness, i.e., at least one micron, to retain its properties since the glass film 18 adjacent to the barrier layer 17 dissolves some of the barrier layer. For example, silicon dioxide ($SiO_2$) is extremely soluble in the above glass and forms a part thereof. Inasmuch as glass generally is a good electrically non-conductive material, a portion of the barrier layer can be dissolved into or by the glass film without altering the properties of the glass. Moreover, the glass film 18 can be deposited over a portion of the body 11 of semiconductor material not having barrier layers 16 and 17 deposited thereon.

The glass film 18 initially comprises an organic solution containing a powdered glass frit of any suitable glass or vitreous material preferably having a temperature coefficient of expansion similar to the temperature coefficient of expansion of the body 11 of semiconductor material. The preparation of such frits is well known in the art and consists, e.g., of melting together the specified percentages of boric oxide, silicon dioxide, and lead oxide, cadmium oxide or barium oxide and pouring the molten composition into water to form a glass frit. The batch ingredients may, of course, be any compound that will yield the desired oxides under the fusing conditions of frit production, i.e., boric oxide will be obtained from boric acid, silicon dioxide will be produced from flint, lead oxide will be produced from red lead or white lead, barium oxide will be produced from barium carbonate, etc. The glass frit is then preferably milled for 2 to 20 hours, e.g., in a ball mill, with water to form a powdered glass frit having a particle size passable through a 325 mesh screen. Before depositing the powdered glass frit on the body 11 of semiconductor material, it is preferably suspended in a vehicle consisting of most any of the well known organic compounds capable of being completely volatilized or decomposed by heat. One such mixture of organic compounds which will maintain the powdered glass frit slurried is ethyl cellulose with butyl carbital acetate.

In order to fuse powdered glass frit onto the barrier layer 17, the body 11 of semiconductor material with the powdered glass frit suspended in a vehicle and deposited over the barrier layer 17 is fired at a temperature of approximately 900° C. to fuse the powdered glass frit into a glass film 18 and drive off the organic vehicles. The softening point of the glass is critical in that it must be below the processing temperatures of the active device 12. The body 11 of semiconductor material with the glass film 18 is then allowed to cool and suitable electrically conductible pads 19 are deposited by screening or the like onto the glass film 18. Firing of the pads fuses the pads 19 to the glass film 18.

A glass matrix passive device 20, e.g., a glass matrix resistance element 21, is then deposited by suitable means such as by screening or by vacuum deposition, over the glass film 18 and over the edges of the pads 19. The formulation of one of the glass matrix resistance elements 21 employing a powdered glass frit has a softening point of approximately 750° C. It is critical that the powdered glass frit employed in the formulation have a softening point below the softening point of the glass film 18. Otherwise the glass matrix resistance element will dissolve in the glass film 18 and short the resistance element to the body of semiconductor material if the thickness of the barrier layer is insufficient. A glass matrix passive device 20 can also be deposited directly on the barrier layer if the layer is thick enough, i.e., in excess of .1 micron and extreme care is taken in firing the device 20 to prevent absorption of the composition into the barrier layer. This is accomplished by limiting the firing temperature to 20% above the softening point of the glass. An example of a glass composition employed in the formulation of the glass matrix resistance element 21 having a softening point of approximately 750° C. is as follows:

| Glass composition: | Percent by weight |
|---|---|
| PbO | 63 |
| $B_2O_3$ | 25 |
| $SiO_2$ | 12 |

Depending upon the sheet resistance desired, a predetermined percentage of one of the noble metals, e.g., gold (Au), silver (Ag), platinum (Pt), palladium (Pd), iridium (Ir), rhodium (Rh), osmium (Os), and ruthenium (Ru), or an oxide thereof with a particle size passable through a 325 mesh or less is combined with the powdered glass frit and a vehicle. The noble metals can also be in molecular form, in other words, the metal atoms may be directly attached to carbon atoms such as in an organometallic compound, e.g., resinates, naphthanates, glycinates, etherates, esterates, and the like. Each of the organometallic compounds can be mixed with a suitable vehicle to obtain the proper consistency. The resistance element formulation is then fired between 750° to 850° C. to soften and fuse the glass particles to the glass film 18 and to decompose or volatilize the organic portions thereof to produce the glass matrix resistance element 21. A thorough disclosure of various formulations and method of making the glass matrix resistance elements is revealed in Daily et al. copending patent application, Ser. No. 131,491, filed Aug. 15, 1961, entitled, Electrical Resistance Element and Method of Making the Same which was refiled as a continuation application and issued as Patent No. 3,329,526 on July 4, 1967, and in Faber, Sr., et al. copending patent application, Ser. No. 322,702, filed Nov. 12, 1963, entitled Electrical Resistance Element and Resistance Composition and issued as Patent No. 3,304,199 on Feb. 14, 1967, both applications being assigned to the same assignee as the present invention.

In certain electronic circuit applications, it is preferable that a thin film glas matrix capacitor 30 be employed instead of a resistance element or else it is preferable that both a capacitor 30 and a resistance element 21 be employed with the active device 12. Since the dielectric-forming compounds of the capacitor 30 must be fired at a temperature slightly higher than the firing temperature of the glass matrix resistance element 21, it is necessary that the capacitor 30 be deposited and fired on the glass film 18 prior to the resistance element 21 if both types of passive devices are to form part of the integrated circuit 10. A thin film glass matrix capacitor 30, such as disclosed in now abandoned copending patent application to Boykin, Ser. No. 283,729, filed May 28, 1963, entitled, Thin Film Capacitor and Method of Making the Same, and assigned to the same assignee as the present invention, is fired in the same manner as the glass matrix resistance element 21. Briefly, the capacitor consists of a first electrically conductible layer or bottom electrode 31 fused onto the glass film 18, the electrode 31 being provided with an edge portion **31*a* overlapping a portion of the pad 19*a*, a dielectric layer 32 of powdered glass particles and high dielectric-forming materials, such as tantalum, tungsten, niobium, titanium, hafnium, and zirconium, the oxides thereof having excellent dielectric properties, fused with glass particles onto the bottom electrode 31, and a second electrically conductible layer or top electrode 33 covering a substantial area of the dielectric layer and having an edge portion 33*a* overlapping the other of the pads 19*a*. It is to be understood that the electrodes 31 and 33 need not be connected to the pads 19*a* and that the edge portions 31*a* and 33*a*** thereof can be used as pads. Further details regarding the thin film capacitor can be obtained from the above copending patent application to Boykin.

After the glass matrix passive devices 20 have been fused onto the glass film 18, additional portions of the barrier layer 17 are etched away to expose a portion of the inner semiconductor layer 14 and the outer semiconductor layer 15. As shown in the drawings, the inner semiconductor layer 14 is connected to the resistance element with pad **19*b* and the outer semiconductor layer 15 is connected to termination pad 19*c*** to which may be bonded suitable leads or the like.

While there has been illustrated and described what is at present considered to be a prefered embodiment of the present invention it will be appreciated that numerous changes and modifications are likely to occur to those skilled in the art, and it is intended in the appended claims to cover all those changes and modifications which fall within the true spirit and scope of the present invention.

What is claimed as new and desired to be secured by Letters Patent of the United States is:

1. An integrated circuit comprising a semiconductor body of the first conductivity type (P), an inner semiconductor layer of a second conductivity type (N) on the semiconductive body, an outer semiconductor layer of the first conductivity type (P) on the inner semiconductor layer, a barrier layer of an oxide of the semiconductor body fused to a portion of the surface of the semiconductor body, a glass film bonded to the barrier layer, and a glass matrix resistance element having a thickness of between 0.0001 to 0.0005 inch and a sheet resistance of 100 to at least as high as 300,000 ohms per square fused onto the glass, the device being electrically connected to one of the semiconductor layers.

2. The integrated circuit of claim 1, wherein a thin film capacitor is fused onto the glass and electrically connected to the resistance element.

3. An integrated circuit comprising a semiconductor body of the first conductivity type (N), an inner semiconductor layer of a second conductivity type (P) on the semiconductor body, an outer semiconductor layer of the first conductivity type (N) on the inner semiconductor layer, a barrier layer of an oxide of the semiconductor body fused to a portion of the surface of the semiconductor body, a glass film bonded to the barrier layer, and a glass matrix resistance element having a thickness of between 0.0001 to 0.0005 inch and a sheet resistance of 100 to at least as high as 300,000 ohms per square fused onto the glass, the device being electrically connected to one of the semiconductor layers.

4. The integrated circuit of claim 3, wherein a thin film capacitor is fused onto the glass and electrically connected to the resistance element.

References Cited

UNITED STATES PATENTS 3,178,804 4/1965 Ullery et al. ______ 317—101 X

ROBERT K. SCHAEFER, *Primary Examiner.*

W. C. GARVERT, *Assistant Examiner.*